(12) United States Patent
Dubok et al.

(10) Patent No.: US 12,742,841 B2
(45) Date of Patent: Sep. 22, 2026

(54) RADIO FREQUENCY RF TRANSMIT COIL FOR A MAGNETIC RESONANCE IMAGING SYSTEM AND MAGNETIC RESONANCE IMAGING SYSTEM COMPRISING THE COIL

(71) Applicant: KONINKLIJKE PHILIPS N.V., Eindhoven (NL)

(72) Inventors: Aleksei Dubok, Best (NL); Wouter Carel Marinus Numan, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 151 days.

(21) Appl. No.: 18/854,557

(22) PCT Filed: Apr. 12, 2023

(86) PCT No.: PCT/EP2023/059531
§ 371 (c)(1),
(2) Date: Oct. 7, 2024

(87) PCT Pub. No.: WO2023/198761
PCT Pub. Date: Oct. 19, 2023

(65) Prior Publication Data

US 2025/0224465 A1 Jul. 10, 2025

(30) Foreign Application Priority Data

Apr. 14, 2022 (NL) ..................................... 2031589

(51) Int. Cl.
*G01R 33/34* (2006.01)

(52) U.S. Cl.
CPC .............................. *G01R 33/34076* (2013.01)

(58) Field of Classification Search
CPC ........................ G01R 33/34076; G01R 33/288
See application file for complete search history.

(56) References Cited

U.S. PATENT DOCUMENTS 6,661,229 B2 * 12/2003 Weyers ............ G01R 33/34046 324/318
2007/0066885 A1 3/2007 Vaughan
(Continued)

FOREIGN PATENT DOCUMENTS

CN 112130104 A 12/2020
CN 112162224 A 1/2021

OTHER PUBLICATIONS

International Search Report and Written Opinion from PCT/EP2023/059531 dated Jun. 29, 2023.
(Continued)

*Primary Examiner* — G.M. A Hyder

(57) ABSTRACT

A radio frequency RF transmit coil (5) for transmitting an RF field into a magnetic resonance examination zone (3) of a magnetic resonance imaging system (1) with a carrier structure (7) for separating the examination zone (3) from the RF transmit coil (5), wherein the carrier structure (7) is surrounded by an RF transmit antenna (6) of the RF transmit coil. The carrier structure (7) is made of a first material having a first dielectric permittivity, wherein at least one recess (20) is foreseen in the carrier structure (7) between a layered capacitors structure (13) of the RF transmit antenna and a patient (8) in the examination zone (3), wherein the recess (20) extends fully circumferentially along the carrier structure (7). The recess (20) is filled with at least a second material, so that the second material encircles the carrier structure (7) as an extra layer, the second material having a second dielectric permittivity, wherein the second dielectric permittivity of the second material is higher as the first dielectric permittivity of the first material of the carrier structure (7).

11 Claims, 8 Drawing Sheets

(56) References Cited

U.S. PATENT DOCUMENTS

| | | | |
|---|---|---|---|
| 2008/0054901 | A1 | 3/2008 | Eberler et al. |
| 2009/0009169 | A1 | 1/2009 | Schulz |
| 2011/0043208 | A1 | 2/2011 | Leussler et al. |

OTHER PUBLICATIONS

Neufeld A et al: "Dielectric inserts for sensitivity and RF magnetic field enhancement in NMR volume coils", Journal of Magnetic Resonance, Academic Press, Orlando, FL, US, vol. 200, No. 1, Sep. 1, 2009 (Sep. 1, 2009), pp. 49-55.

* cited by examiner

RADIO FREQUENCY RF TRANSMIT COIL FOR A MAGNETIC RESONANCE IMAGING SYSTEM AND MAGNETIC RESONANCE IMAGING SYSTEM COMPRISING THE COIL

CROSS REFERENCE TO RELATED APPLICATIONS

This application is a U.S. national phase application of International Application No. PCT/EP2023/059531 filed on Apr. 12, 2023, which claims the benefit of NL Application Serial No. 2031589 filed on Apr. 14, 2022 and is incorporated herein by reference.

FIELD OF THE INVENTION

The invention relates to the field of radio frequency RF transmit coils for magnetic resonance imaging systems. In particular, the invention relates to an improved carrier structure for RF transmit coils.

BACKGROUND OF THE INVENTION

A magnetic resonance imaging system 1 consists of three cylindrical concentric subsystems: the static magnet 2, the gradient coils 4, and the quadrature body coil 5, surrounding the carrier structure 7 or patient bore as shown in FIG. 1.

Gradient coils 4 generate a gradient in the static magnetic field that is used to localize the image signal and pulses at a frequency in the kHz range. Between the gradient coils 4 and the carrier structure 7 is the quadrature body coil 5, which transmits and receives RF field pulses in the MHz range that are used for image acquisition.

A typical body coil 5 design is the birdcage, which consists of a number of conductive rods, also known as rungs 12, along the central axis of the patient bore, connected on both ends to each other by two large rings 9, 10. The body coil 5 typically has the conductive rings 9, 10 and rungs 12 printed out on a large PCB. This PCB folds into a cylindrical shape and connects at the edges to form a birdcage. The overlapped parts of printed rungs 12 and rings 9, 10 form the capacitor's structures 13 of the antenna body coil 6. The sizes of those capacitors are adjusted in order to have the birdcage coil 5 attain electric resonance at a predetermined frequency and optimize electromagnetic power delivery.

FIG. 1 schematically depicts an MRI system 1 showing the location of a gradient coil 4, a body coil 5 and a carrier structure 7 according to the state of the art. FIG. 1 *a*) shows a cross section side view of the MRI system 1 and FIG. 1 *b*) a front view of the MRI system 1. A Patient 8 is positioned inside the patient bore or body coil carrier structure 7. The region of interest for an MRI scan should typically be in the geometrical center of the body coil 5. In this region, the homogenous H-field or B1+ field is created for an MR scan. Due to the nature of the antenna PCB design with integrated capacitors, some locally prominent electric fields could also be directed towards the bore and the patient. These fields could expose the patient to high RF power coupling and potentially harmful rises in tissue temperature. The ring sections 9, 10 have some of the strongest electric fields of the body coil, especially at the edges of the overlap capacitors 13 on the patient side 16.

FIG. 2 *a*) presents an example of a patient 8 position for an abdominal scan. For this scan, the patient's shoulders and wrists are at the closest position to the ring capacitor 13 and experience the highest SAR values. FIG. 2 *b*) presents a cross-section view along the body coil antenna 6 and carrier structure 7 stack-ups. The typical distance of the patient 8 from the support structure 7, where it is closest to the ring capacitor, may be only a few centimeters or even less.

FIG. 3 schematically depicts a body coil antenna 6 with a standard carrier structure 7 stack-up according to the state of the art, wherein FIG. 3 *a*) shows a front view of the body coil antenna 6, FIG. 3 *b*) shows a cross-section view along the body coil antenna 6 and the carrier structure 7 stack-up and FIG. 3 *c*) an isometric view on the carrier structure 7.

A time-varying electric field 16 from the layered capacitors 13 of the ring sections 9, 10 of the body coil 5 couples with patient tissue 8, when in close proximity as shown in FIG. 2. This varying field 18 could induce significant temperature increase of the patient tissue and the carrier structure 7 surface itself. In electromagnetic analysis the amount of absorbed RF energy is normalized to the weight of the tissues and parameterized as Specific Absorption Rate (SAR). The maximum value of SAR a patient 8 could be potentially exposed to by any medical device is subject to strict regulations. The resulting heat may present a risk to both patients 8 and parts. Furthermore, the unwanted electric field coupling 18 negatively affects the overall performance of the quadrature body coil and therefore degrades the quality of the resulting MR-image. This effect is well understood, and a number of methods are used to improve the situation nowadays. One possibility is that recesses 19 could be made in the body coil carrier structure 7, between the edges of the antenna capacitor 13 and the patient 8, to modify the local electric field distribution such that it reduces patient coupling. A commonly used method, especially for 1.5 T systems, is to use recesses 19, i.e., a small hole or depression in the body coil carrier structure 7 beneath the edge of the capacitor on the patient side of the antenna PCB as shown in FIG. 4.

FIG. 4 schematically depicts a body coil antenna 6 and a standard carrier structure 7 stack-up in the position of recesses 19 according to the state of the art, wherein FIG. 4 *a*) shows a front view of the body coil antenna 6, FIG. 4 *b*) shows a cross-section view along the body coil antenna 6 and the carrier structure 7 stack-up and FIG. 4 *c*) an isometric view on the carrier structure 7. The recesses 19 shown in FIG. 4 form an extra layer of air, with a thickness of half of the carrier structure 7 thickness (4 mm) with a dielectric permittivity approximately equal to 1. The typical carrier structure consists of glass reinforced epoxy with dielectric permittivity 4.4 with a thickness of 8 mm. For this case, recesses 19 act as field scatterer, which leads to a decrease of local electric field density towards the inside of the bore. However, this method has a fundamental limit since there is no material with dielectric permittivity less than 1 and as a result scattering process is limited as well. Furthermore, quadrature body coils 5 with two capacitors in between rungs 12, require double the recesses (64 recesses in total for a sixteen rung body coil). This leads to the structural weakness in the carrier structure 7, as well as insufficient contact surface to support the antenna PCB.

From document US 2008/0054901 A1 a dividing wall made from at least one first wall material for delimitation of a patient positioning region from an antenna structure of a magnetic resonance tomography apparatus is known. The dividing wall has at least one region at which a specific sub-structure of the antenna structure is located on the side of the dividing wall facing away from the patient positioning region, at which the dividing wall has a wall part made from a second wall material with a dielectric constant that is lower than the dielectric constant of the first wall material.

The Chinese patent application CN 11 2162 224 discloses an RF probe for MR animal scanning. This known RF probe has a birdcage configuration and comprises a cylindrical housing which end rings in the form of arc-shape copper strips and axial copper strips connected by non-magnetic capacitors. A dielectric ceramic unit is provided over the axial length of the cylindrical housing on the inner side of the inner wall substrate of the housing.

The direct coupling of the electric field between the body coil ring and the patient tissue and the associated SAR effects are an important patient safety and regulatory issue. Existing methods for SAR reduction through the use of recesses are limited and introduce potential reliability issues.

SUMMARY OF THE INVENTION

It is an object of the invention to improve the patient SAR reduction associated with the direct coupling of electric field from the layered capacitors inside the body coil towards the patient.

According to the invention, this object is addressed by the subject matter of the independent claims. Preferred embodiments of the invention are described in the sub claims.

Therefore, according to the invention, a radio frequency RF transmit coil for transmitting an RF field into a magnetic resonance examination zone of a magnetic resonance imaging system is foreseen, the RF transmit coil comprising: an RF transmit antenna wherein the RF transmit antenna is formed by a plurality of rungs disposed along a central axis of the examination zone around a volume, a first end ring connected to a first end of the plurality of rungs, a second end ring connected to a second end of the plurality of rungs, wherein a layered capacitors structure is formed by the overlapping parts of the rungs and the first end ring and the second end ring, a carrier structure for separating the examination zone from the RF transmit coil, wherein the carrier structure is surrounded by the RF transmit antenna, wherein the carrier structure is made of a first material having a first dielectric permittivity, wherein at least one recess is foreseen in the carrier structure between the layered capacitors structure and a patient in the examination zone, wherein the recess extends fully circumferentially along the carrier structure, wherein the recess is filled with at least a second material, so that the second material encircles the carrier structure as an extra layer, the second material having a second dielectric permittivity, wherein the second dielectric permittivity of the second material is higher as the first dielectric permittivity of the first material of the carrier structure. The recess further extends partially axially along the carrier structure over the axial extension of at least one of the first and second end rings. In an embodiment of the invention, recesses that extend partially axially along the carrier structure to cover the first and second end rings, respectively. That is, according to the invention, the recesses coverage is limited to the axial extension(s) of the end ring(s), optionally with some additional margin axially extending beyond the end rings axial extensions. Typically, the axial extension of the recess is in the range of 2 to 15 cm, typically about 7 cm, which is at least one or two orders of magnitude less than the full axial extension of the carrier structure, i.e. the axial length of the RF transmit coil. These recesses may be filled with dielectric material forming gaskets located underneath the ring sections of the body coil antenna reducing electric field coupling with the patient's body, notably at the end rings.

The recesses located underneath the ring sections of the body coil antenna, which are filled with a material with a higher dielectric constant than the material of the support structure, ensure that this results in less coupling of the electric field with the patient, especially in the areas closest to the surface of the support structure. Therefore a means to reduce the electric field induced specific absorption rate (SAR) of a patient is provided, thus improving patient safety and comfort or as an alternative allows to apply more RF power and shorten the scan time. Unwanted system interaction between the body coil and the patient or receive coils, such as changes in body coil tuning as well as matching, could be mitigated. The risks of inner bore heating will be reduced. As a result of less unwanted system interaction, image quality will improve. With reduced SAR values, it could be more freedom to apply more RF power and shorten scan times. The benefits of the invention are the reduction of electric field coupling to the patient from the body coil antenna. As a result the harmful patient exposure by the electric field or the patient SAR will be reduced improving the patient safety and comfort. Furthermore unwanted system interaction between the body coil and the patient or receive coils, such as changes in body coil tuning as well as matching, could be mitigated. Whereby the image quality will be improved. The risks of inner bore heating will be reduced. Another advantage is that with reduced SAR values, it could be more freedom to apply more RF power and shorten scan times. The recesses filled with a material can be viewed as a gasket extending fully circumferentially along the carrier structure. Thus, SAR could be reduced and patient safety and comfort improves as well as image quality. As dielectric material a material with a dielectric permittivity different from that of either air or the carrier structure material is used. Thus, instead of scattering electric field, which is coupled to the patient, the electric field is contained and blocked within the dielectric material. Using a material with significantly higher dielectric permittivity than the carrier structure material, the effect of wavelength shortening is favored. This effect allowing more of the electric field to be compressed and contained inside the material. In addition, this increases the in-boundary reflectivity and reduces the field transmission. This is similar to the Bragg's law, which describes the diffraction maxima and allow to estimate the possibility of reflected field attenuation: $2d \sin \theta = n \lambda$, where n is a positive integer and $\lambda$ is the wavelength of the incident wave, d gasket thicknesses and $\theta$ the wave incidence angle. The gaskets located underneath the ring sections of the body coil antenna ensure that these effects lead to less electric field coupling with the patient, especially in the regions which are closest to the carrier structure surface. This reduces SAR and improves patient safety and comfort as well as image quality.

In an advantageous embodiment of the invention the width of each recess along the rungs corresponds at least to the size of the overlapping parts of the rungs and the first end ring and second end ring.

In an advantageous embodiment of the invention the carrier structure thickness is between 8 mm to 12 mm and the depth of the recess is between 2 mm and 6 mm.

In an advantageous embodiment of the invention the dielectric material in the recess has a permittivity between 50 and 100.

In an advantageous embodiment of the invention the recess is filled with at least two different materials forming an outer layer at a system side and an inner layer between the carrier structure and the outer layer to a patient side, wherein the permittivity of the outer layer is different than from the inner layer. The SAR could be further enhanced by applying the effect multiple times between the body coil antenna and the patient. This could be done by introducing a multilayered carrier structure gasket instead of a single layer.

In an advantageous embodiment of the invention the dielectric permittivity of the outer layer is higher than the dielectric permittivity of the inner layer and the dielectric permittivity of the inner layer is higher than the dielectric permittivity of the material of the carrier structure.

In an advantageous embodiment of the invention the outer layer has a dielectric permittivity between 50 and 100 and the inner layer has a dielectric permittivity between 5 and 10.

In an advantageous embodiment of the invention the thickness of the inner layer and the thickness of the outer layer are each half the depth of the recess.

In an advantageous embodiment of the invention the recess is filled with more than two layers of different materials.

In an advantageous embodiment of the invention the RF transmit coil is a quadrature body coil of a birdcage coil.

The invention further relates to a magnetic resonance imaging system comprising a RF transmit coil as described above.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

FIGS. 1 to 4 show prior art embodiments and have already been described in the introductory part of the description.

Figure 1:
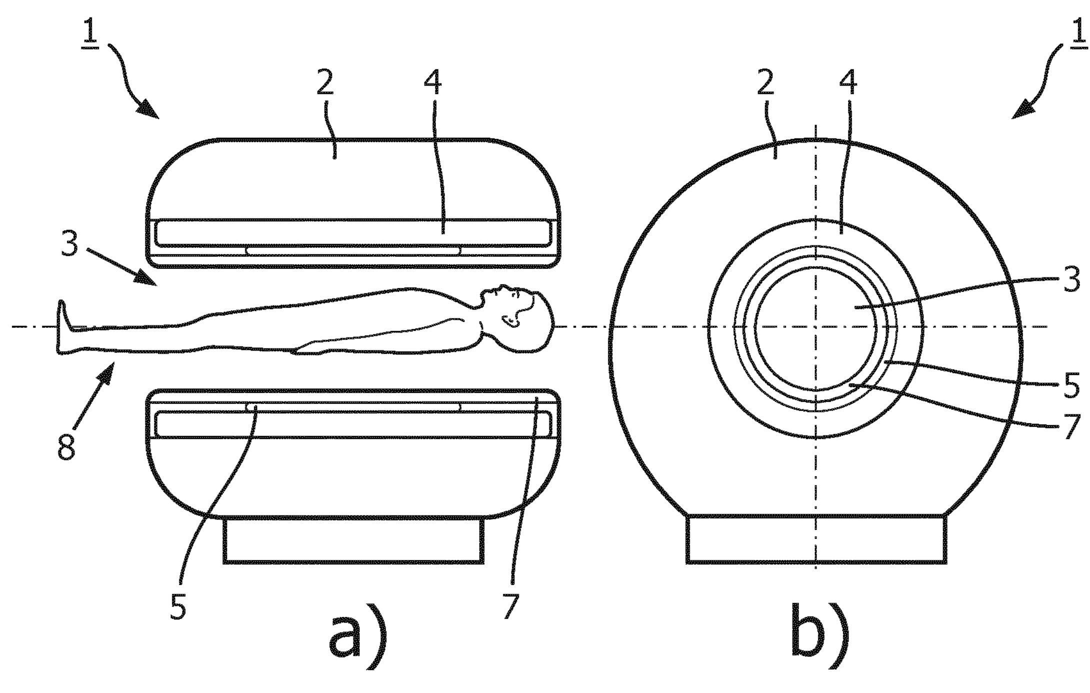
FIG. 1 schematically depicts an MRI system showing the location of a gradient coil, a body coil and a carrier structure according to the state of the art, wherein FIG. 1 *a*) shows a cross section side view of the MRI system and FIG. 1 *b*) a front view of the MRI system, FIG. 2 schematically depicts the patient position in the carrier structure towards the body coil antenna for an abdominal scan with the antenna and carrier structure stack-ups in the position of most significant electric field coupling to the patient according to the state of the art, wherein FIG. 2 *a*) shows a front view of the patient position in the carrier structure and FIG. 2 *b*) a cross section view along body coil antenna and carrier structure stack-ups, FIG. 3 schematically depicts a body coil antenna and a standard carrier structure stack-up according to the state of the art, wherein FIG. 3 *a*) shows a front view of the body coil antenna, FIG. 3 *b*) shows a cross-section view along the body coil antenna and the carrier structure stack-up and FIG. 3 *c*) an isometric view on the carrier structure, FIG. 4 schematically depicts a body coil antenna and a standard carrier structure stack-up in the position of recesses according to the state of the art, wherein FIG. 4 *a*) shows a front view of the body coil antenna, FIG. 4 *b*) shows a cross-section view along the body coil antenna and the carrier structure stack-up and FIG. 4 *c*) an isometric view on the carrier structure, FIG. 5 schematically depicts a body coil antenna and a carrier structure stack-up in the position of a recess filled with a material according to an embodiment of the invention, wherein FIG. 5 *a*) shows a front view of the body coil antenna, FIG. 5 *b*) shows a cross-section view along the body coil antenna and the carrier structure stack-up and FIG. 5 *c*) an isometric view on the carrier structure, FIG. 6 schematically depicts a body coil antenna and a carrier structure stack-up in the position of a recess filled with two layers of different materials according to an embodiment of the invention, wherein FIG. 6 *a*) shows a front view of the body coil antenna, FIG. 6 *b*) shows a cross-section view along the body coil antenna and the carrier structure stack-up and FIG. 6 *c*) an isometric view on the carrier structure, FIG. 7 schematically depicts a body coil antenna and carrier structure stack-ups according to an embodiment of the invention.
Figure 2:
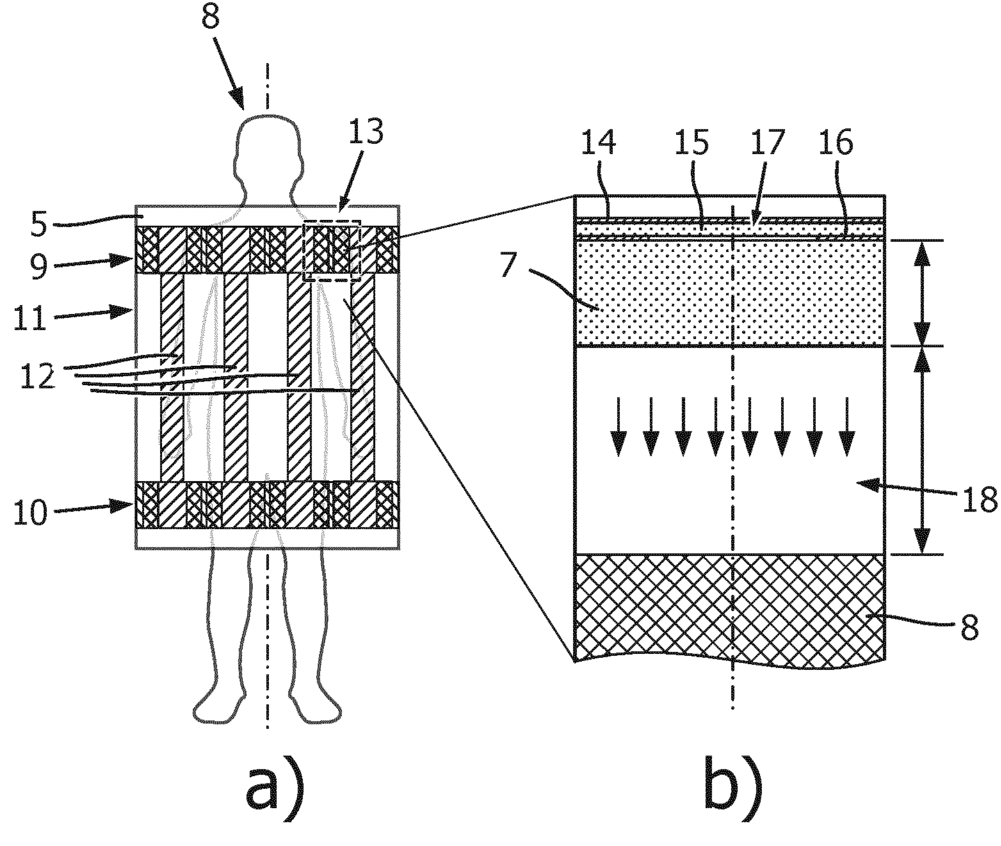
Figure 3:
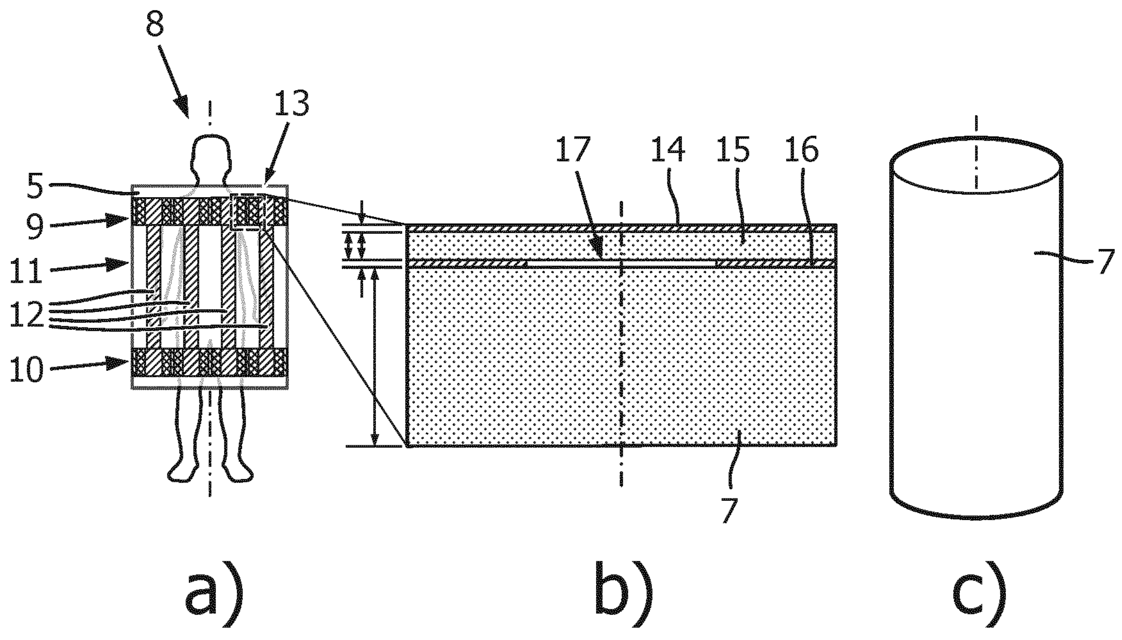
Figure 4:
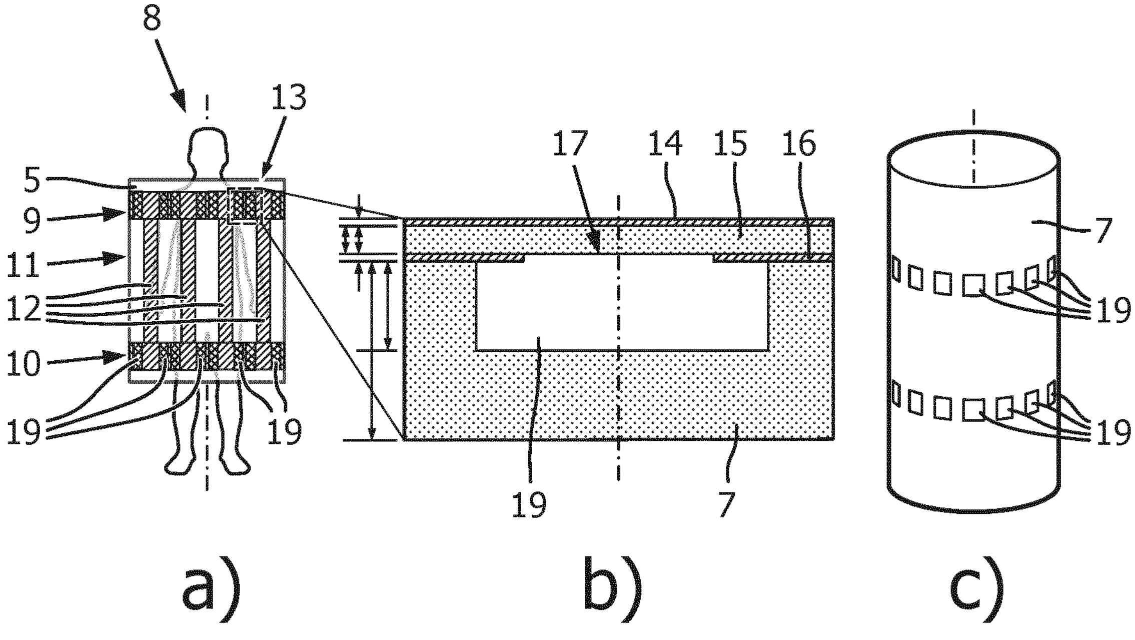
Figure 5:
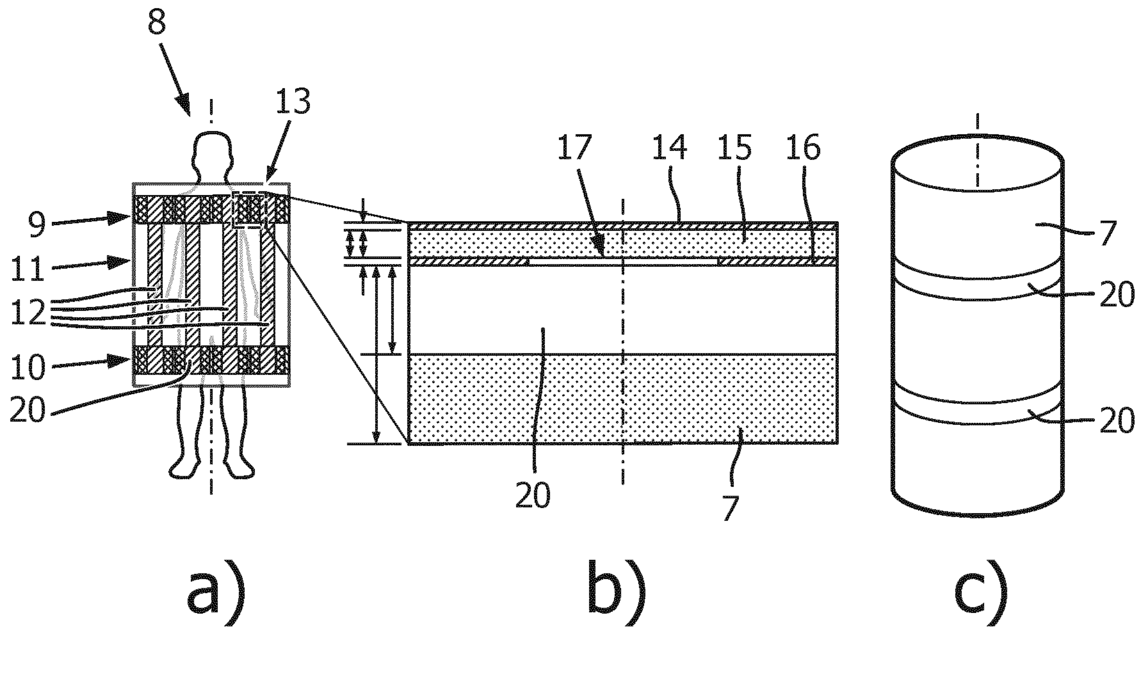

FIG. 5 schematically depicts a body coil antenna 5 and a carrier structure 7 stack-up in the position of a recess filled with a material according to an embodiment of the invention. FIG. 5 *a*) shows a front view of the body coil antenna 5, FIG. 5 *b*) shows a cross-section view along the body coil antenna 5 and the carrier structure 7 stack-up and FIG. 5 *c*) an isometric view on the carrier structure 7. The RF transmit antenna 5 is formed by a plurality of rungs 12 disposed along a central axis of the examination zone 3 around a volume forming a rung section 11. A first end ring 9 is connected to a first end of the plurality of rungs 12 and a second end ring 10 is connected to a second end of the plurality of rungs 12. A layered capacitors structure 13 is formed by the overlapping parts of the rungs 12 and the first end ring 9 and the second end ring 10. Furthermore, FIG. 5 shows a carrier structure 7 for separating the examination zone 3 from the RF transmit coil 5. The carrier structure 7 is surrounded by the RF transmit antenna 6. The RF transmit antenna consists of a system side antenna 14, an antenna dielectric 15 and a patient side antenna 16. Also, an open portion 17 of the capacitors 13 can be seen on the ring portions 9, 10 of the carrier structure 7. The carrier structure 7 is made of a first material having a first dielectric permittivity, wherein at least one recess 20 is foreseen in the carrier structure 7 between the layered capacitors structure 13 and a patient 8 in the examination zone 3, wherein the recess 20 extends fully circumferentially along the carrier structure 7. The recess 20 is filled with at least a second material, so that the second material encircles the carrier as an extra layer, the second material having a second dielectric permittivity, wherein the second dielectric permittivity of the second material is higher as the first dielectric permittivity of the first material of the carrier structure 7. The concept achieves its purpose without a significant redesign of the existing systems. It uses standard layered dielectrics and could be applied as a redesign for most of the existing systems using this type of carrier structure and layered PCB structure, to improve their current SAR performance.

Using advanced computational analysis methods, a layered carrier structure gasket structure was designed, which has a number of advantages as compared with the standard recesses 19. In a first embodiment, the local recess 20 is filled with a solid material that surrounds the support structure like an additional layer. This provides additional mechanical stability to the carrier structure 7 as well as supports the PCB during antenna gluing and prevents structural damage. In a second embodiment, the filler used is a material whose dielectric constant is different from that of the air or the glass fiber reinforced epoxy resin of the support structure 7. Thus, instead of scattering electric field, which is coupled to the patient 8, the electric field is contained and blocked within the filler material. By using a material with a much higher dielectric constant than the material of the carrier structure 7, the wavelength is shortened. This effect allowing more of the electric field to be compressed and contained inside the material. In addition, this increase in boundary reflectivity and reduce the field transmission. This is similar to the Bragg's law, which describes the diffraction maxima and allow to estimate the possibility of reflected field attenuation: $2d \sin \theta = n \lambda$, where n is a positive integer and $\lambda$ is the wavelength of the incident wave, d gasket thicknesses and $\theta$ the wave incidence angle. The gaskets 20 located underneath the ring sections 9, 10 of the body coil antenna 6 ensure that these effects lead to less electric field coupling with the patient 8, especially in the regions which are closest to the carrier structure 7 surface. Thus, SAR could be reduced, and patient safety and comfort improves as well as image quality. The proposed idea could be further enhanced by applying the effect multiple times between the body coil antenna 6 and the patient 8. This could be done by introducing a multilayered carrier structure 7 gasket 21, 22 instead of a single layer 20, shown in FIG. 6. For example, instead of a single-layered carrier structure gasket 20 with the same thickness as the commonly used recess depth of 4 mm as shown in FIG. 5, the multilayered gaskets could consist of two layers 21, 22 of 2 mm thickness each as shown in FIG. 6.

Figure 6:
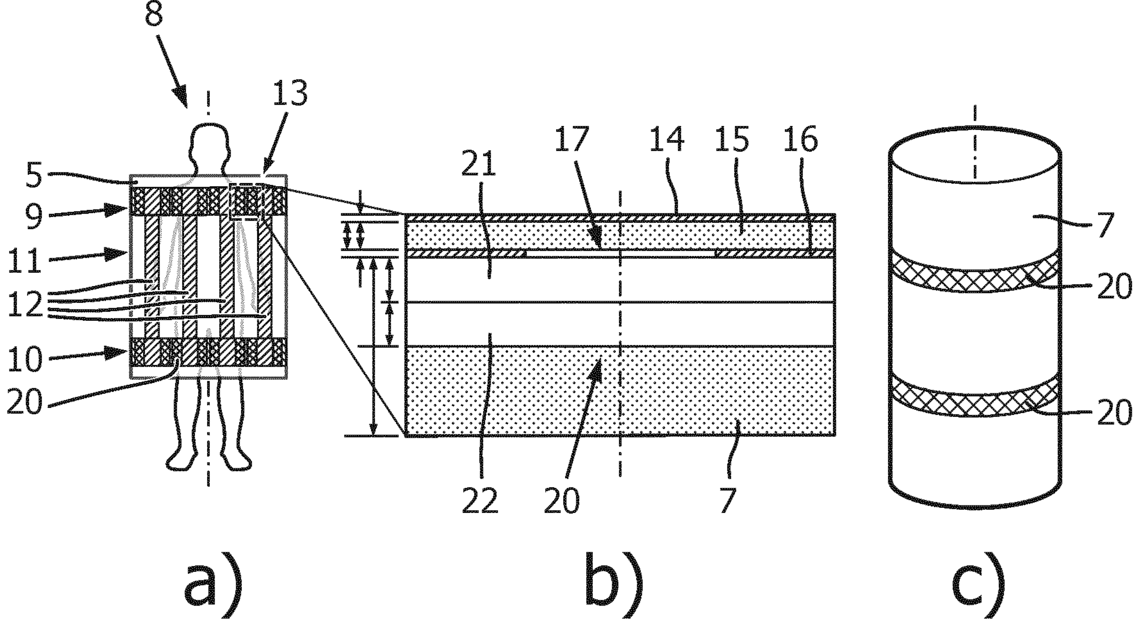

FIG. 6 schematically depicts a body coil antenna 6 and a carrier structure 7 stack-up in the position of a recess 20 filled with two layers 21, 22 of different materials according to an embodiment of the invention. FIG. 6 *a*) shows a front view of the body coil antenna 6, FIG. 6 *b*) shows a cross-section view along the body coil antenna 6 and the carrier structure 7 stack-up and FIG. 6 *c*) an isometric view on the carrier structure 7. In an embodiment of the invention the dielectric permittivity of the outer layer carrier structure gasket 21 (system side) is higher than the dielectric permittivity of the inner layer carrier structure gasket 22 (layer between carrier structure 7 and outer gasket layer 21, patient side), and it, in turn, is higher than the dielectric permittivity of the carrier structure 7. This forms a gradient transmission of dielectric permittivity from body coil antenna 6 to the carrier structure 7. This transmission creates extra boundaries and applies the field blocking mechanism described above several times in a row. Within the Bragg's law varying the thickness of the material could be compensated by the dielectric permittivity difference between layers. As a result, even better electric field coupling reduction could be achieved with multilayered gaskets design.

A number of RF simulations were done to prove the concept. The modeled system was based on a 3 T system Ingenia Elition Rx. Since it is a narrow bore 60 cm system, it could be potentially more critical towards SAR issues. All simulations were done using a detailed 90 kg typical patient model as load. This model defined patient by 32 different types of tissues with at least 315 different blocks including separately segmented muscle-fat-skin structure. Power sensitivity and system power calculations were derived for a normalized B1+ field of 23 uT in the body coil's ISO center. The electric field magnitude, SAR for body parts, Local SAR and Average 1 g SAR calculations were derived for normalized B1+ field of 2.29 uT. This value is equivalent to the B1+ of 13.5 uT for a duty cycle of 2.88%. RF shimming has been applied to all models. Two use cases have been investigated: patient with abdominal in the body coil center and the same loading, but with patient shifted from the center until the body coil carrier structure is touched. The model with recesses has 64 of them in the position of the open parts of the capacitors at the carrier structure's ring sections. The size of each recess is 5 cm×7 cm with a depth of 4 mm. The single-layer gaskets model shown in FIG. 5 has a layer of material with high dielectric permittivity ($\epsilon r=80$). The gasket encircled the carrier structure with an extra layer 4 mm thickness. The height of the layer along the bore carrier structure is 7 cm and it is possessed underneath of the body coil ring section of 8.4 cm. The multilayer gaskets model shown in FIG. 6 contained two layers 21, 22 of material with high dielectric permittivity. There are layers attached to the antenna outer layer carrier structure gasket 21 ($\epsilon r=80$) and the inner layer carrier structure gasket 22 ($\epsilon r=7$). Each layer has a thickness of 2 mm and forms the hoop with 7 cm height underneath of the body coil ring section 9, 10. It is important to notice that the use of dielectric material with lower dielectric permittivity than 80 is still valuable as long as it is still higher than the dielectric permittivity of the carrier structure material, but the overall effect will be reduced.

One of the most crucial loading condition, in terms of electric field coupling 18 towards the patient 8, is the situation, when the patient 8 touching the carrier structure 7. This use case shown in FIG. 7 demonstrates the whole potential of the proposed invention.

Figure 7:
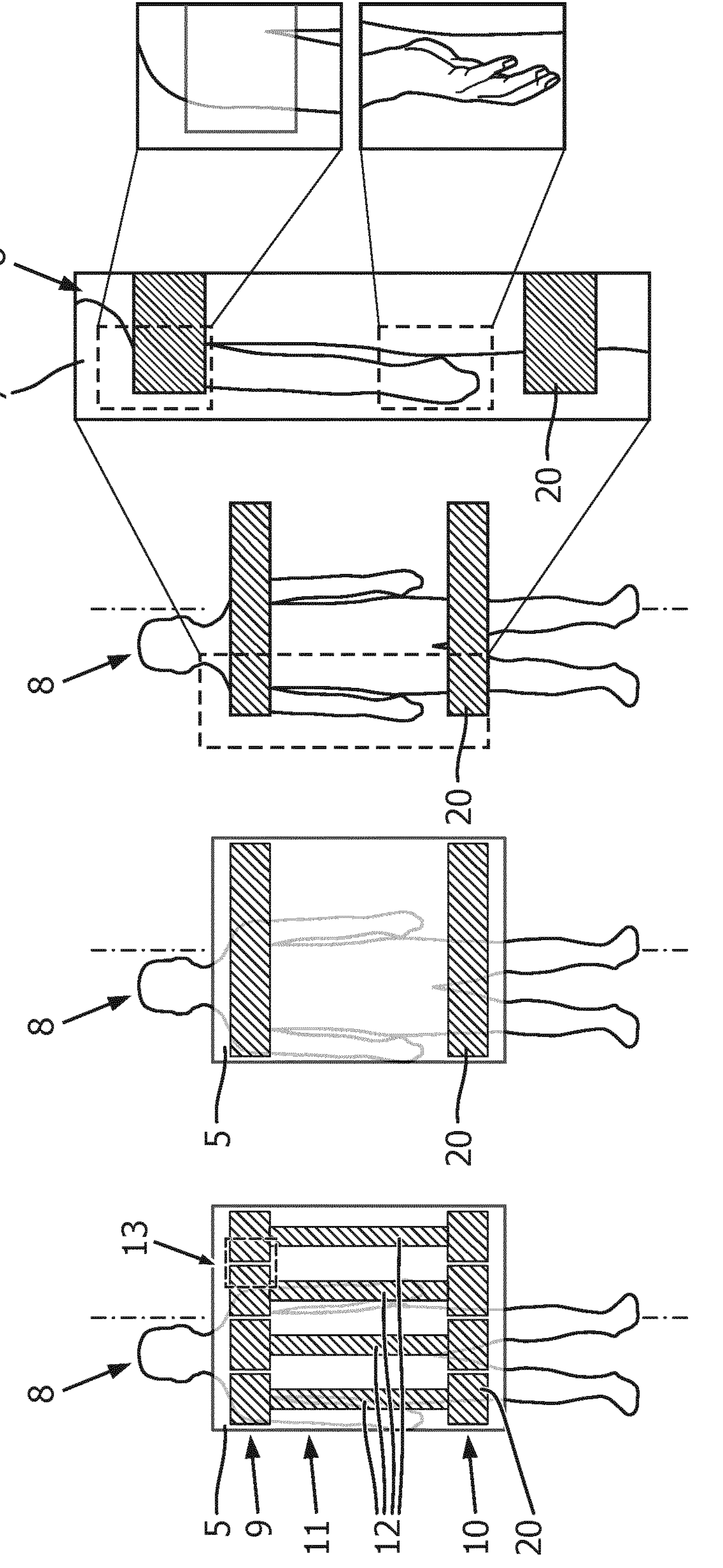

FIG. 7 schematically depicts a body coil antenna 6 and carrier structure 7 stack-ups. In the two image sections on the right side of FIG. 7, the upper image shows the patient's 8 shoulder and the carrier structure 7 region in front of the open part 17 of the ring capacitor 13 and the lower image shows the patient touching the carrier structure with his hand. The differences when the patient 8 touches the carrier structure 7 can be seen in FIGS. 8 and 9 and FIGS. 10 and 11.

Figure 8:
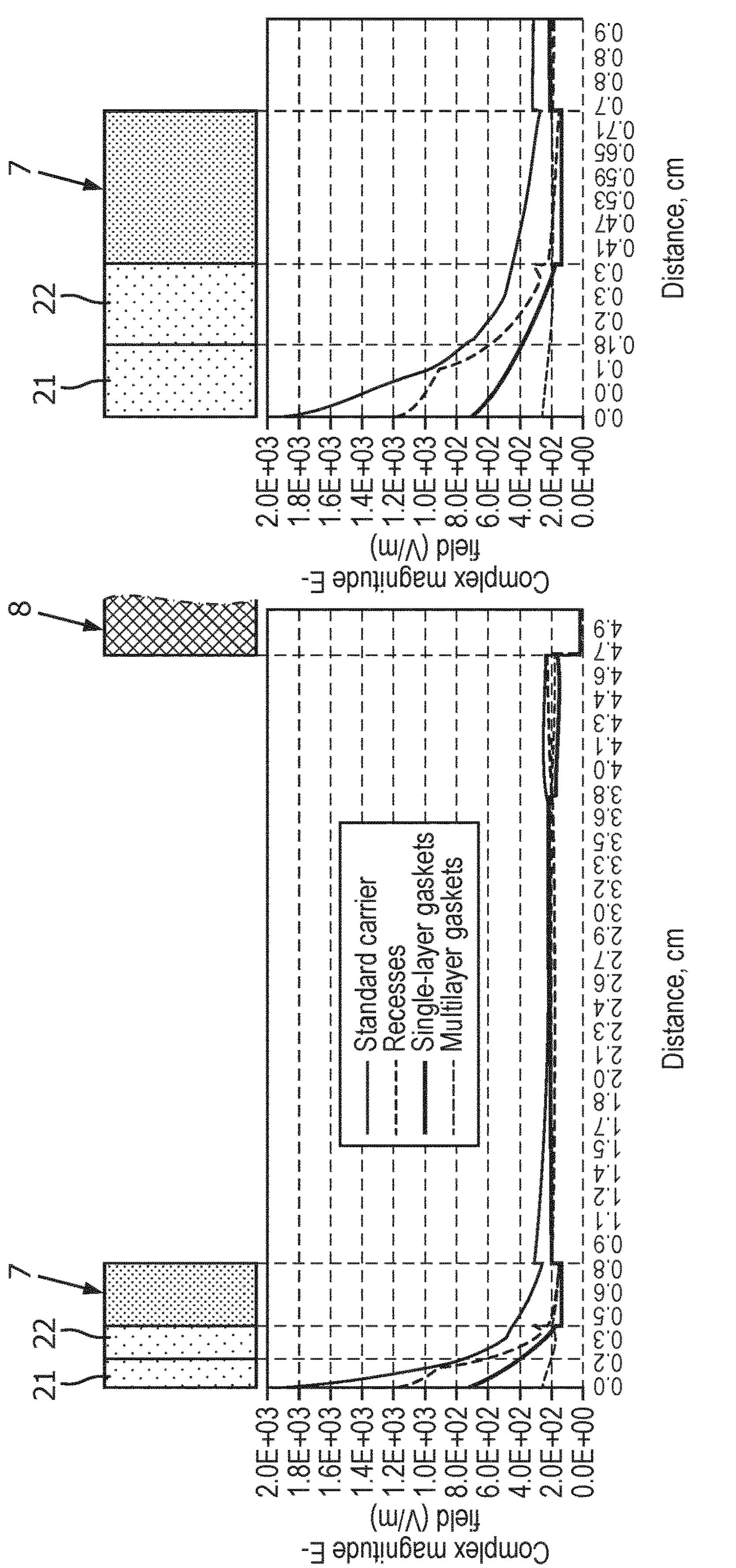
FIG. 8 shows a diagram of the electric field coupling from the open part of the ring capacitor towards the patient tissues for different types of carrier structures according to the state of the art and according to different embodiments of the invention.

FIG. 8 shows a diagram of the electric field coupling 18 from the open part 17 of the ring capacitor 13 towards the patient 8 tissues for different types of carrier structures 7 according to the state of the art and according to different embodiments of the invention. In FIG. 8 the electric field coupling for a standard carrier structure 7, a carrier structure 7 with recesses 19, a carrier structure 7 with single layer gaskets 20 according to an embodiment of the invention and a carrier structure 7 with multilayer gaskets according to another embodiment of the invention are shown. On the right side, the electric field coupling in the area of the carrier structure 7 is shown enlarged. The left side of FIG. 8 shows the electric field coupling 18 in the area of the carrier structure 7, in the area of a space between the carrier structure 7 and the patient 8, and in the area of the patient 8. It can be seen that the values for the magnitude of the electric field with a carrier structure 7 with single layer gaskets 20 according to an embodiment are reduced compared to the carrier structures 7 according to the state of the art. With a carrier structure 7 with multilayer gaskets according to another embodiment of the invention the value can be reduced even further.

Figure 9:
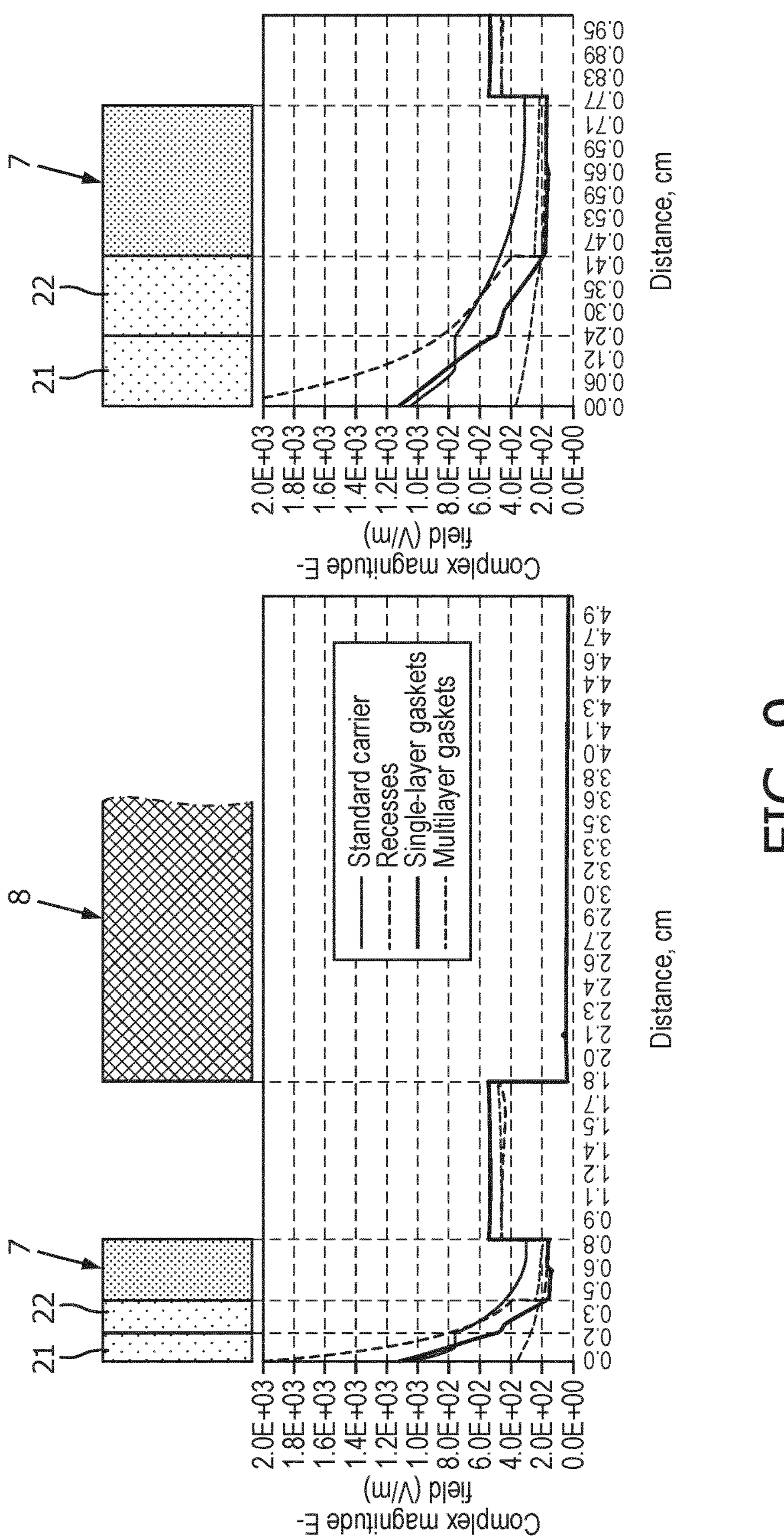
FIG. 9 shows a diagram of the electric field coupling from the open part of the ring capacitor towards the patient tissues for different types of carrier structures the according to the state of the art and according to different embodiments of the invention when patient touching the carrier structure.

FIG. 9 shows a diagram of the electric field coupling 18 from the open part 17 of the ring capacitor 13 towards the patient 8 tissues for different types of carrier structures 7 according to the state of the art and according to different embodiments of the invention when the patient is touching the carrier structure 7. Also, in this case it can be seen that the values for the magnitude of the electric field with a carrier structure 7 with single layer gaskets 20 according to an embodiment are reduced compared to the carrier structures 7 according to the state of the art. With a carrier structure 7 with multilayer gaskets according to another embodiment of the invention the value can be reduced even further.

Figure 10:
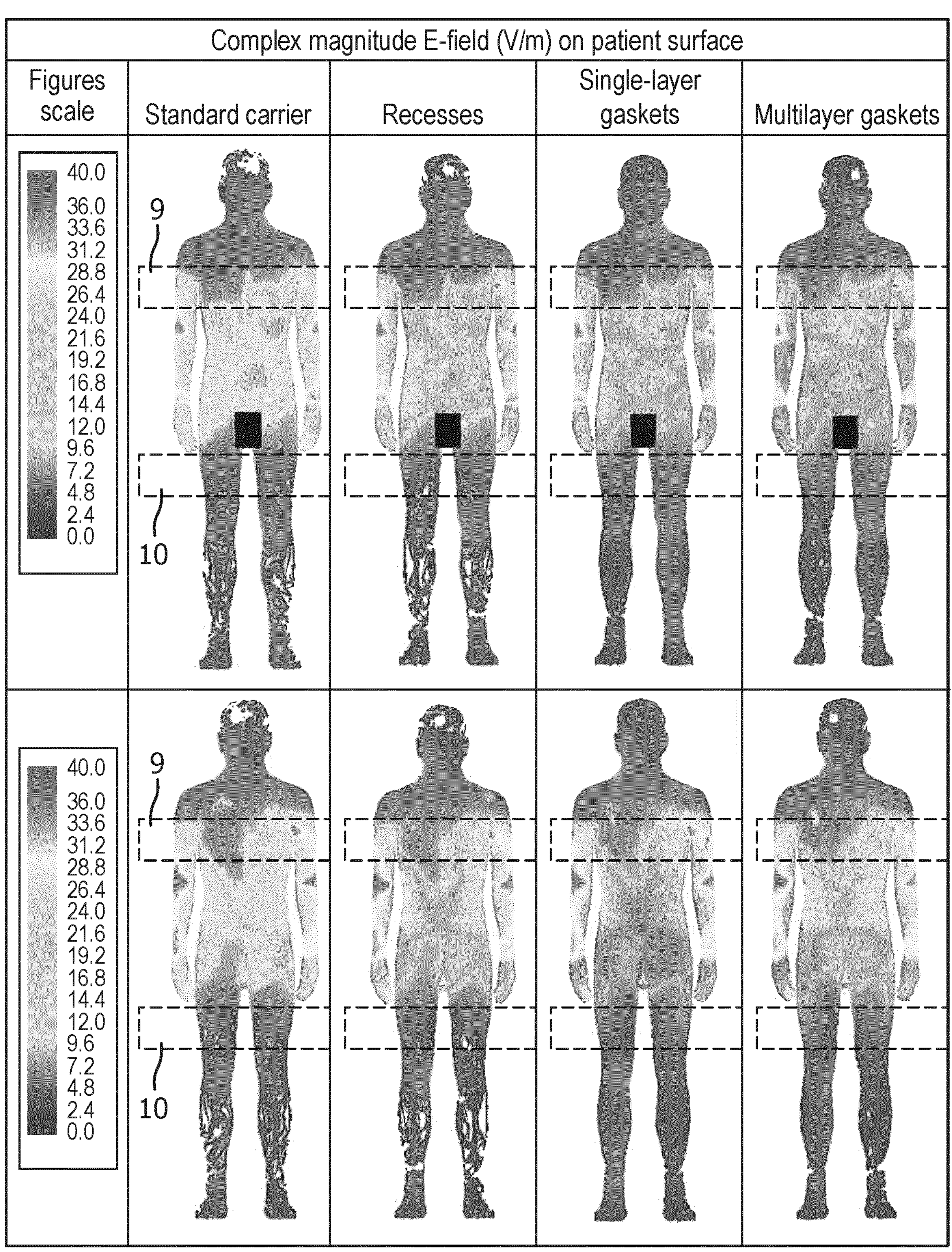
FIG. 10 shows different electric field distributions on the patient surface for different types of carrier structures according to the state of the art and according to different embodiments of the invention.

FIG. 10 shows different electric field distributions on the patient surface for different types of carrier structures according to the state of the art and according to different embodiments of the invention. It can be seen that the values for the magnitude of the electric field are reduced compared to carrier structure 7 known in the prior art.

Figure 11:
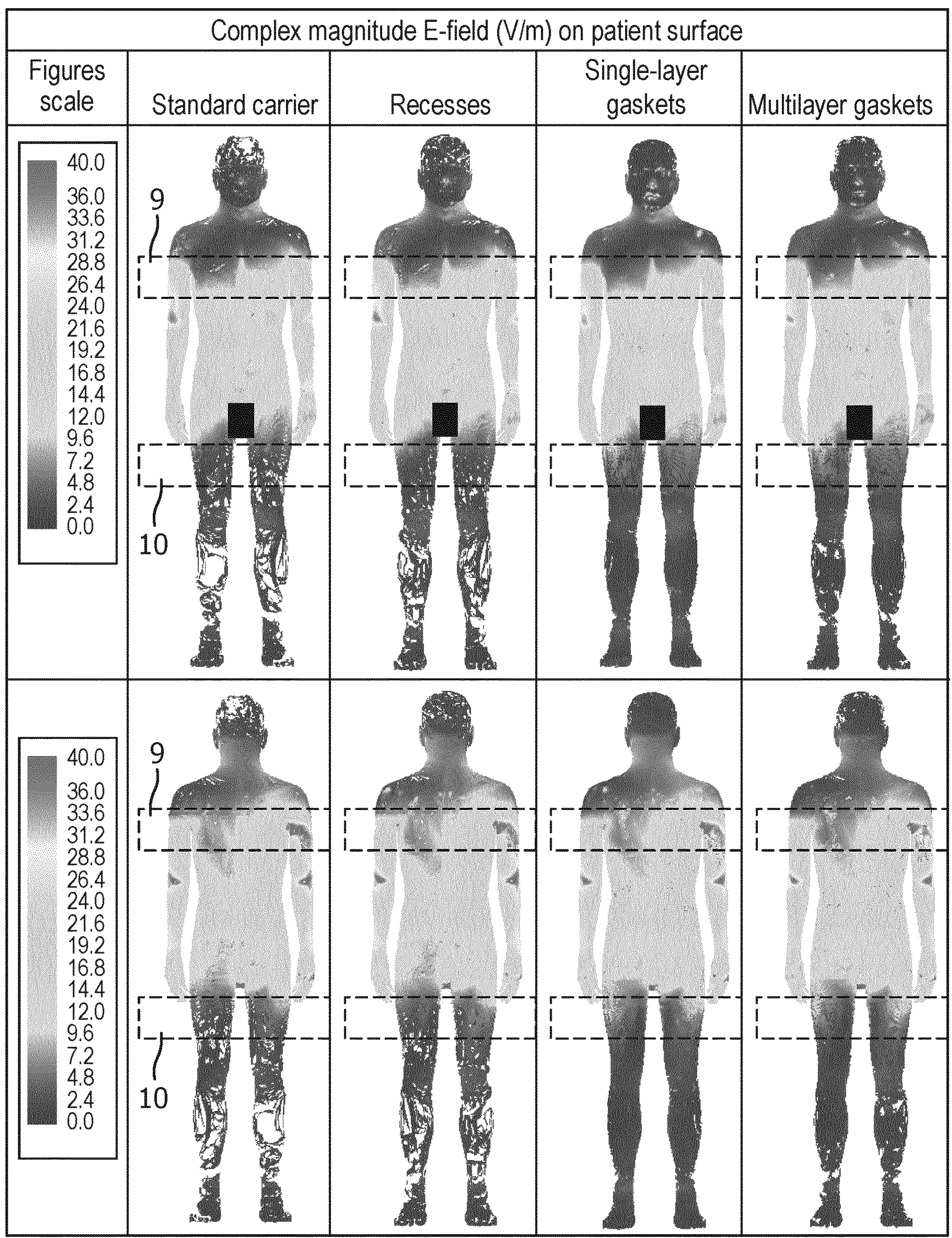
FIG. 11 shows different electric field distributions on the patient surface when the patient is touching the carrier structure for different types of carrier structures according to the state of the art and according to different embodiments of the invention.

FIG. 11 shows different electric field distributions on the patient when the patient is touching the carrier structure surface for different types of carrier structures according to the state of the art and according to different embodiments of the invention. Also in this case, it can be seen that the values for the magnitude of the electric field are reduced compared to carrier structure 7 known in the prior art.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

Embodiments of the invention can be summarized as follows.

Embodiment 1. A radio frequency RF transmit coil (5) for transmitting an RF field into a magnetic resonance examination zone (3) of a magnetic resonance imaging system (1), the RF transmit coil (5) comprising:
- an RF transmit antenna (6) wherein the RF transmit antenna (6) is formed by a plurality of rungs (12) disposed along a central axis of the examination zone (3) around a volume,
- a first end ring (9) connected to a first end of the plurality of rungs (12),
- a second end ring (10) connected to a second end of the plurality of rungs (12),
- wherein a layered capacitors structure (13) is formed by the overlapping parts of the rungs (12) and the first end ring (9) and the second end ring (10),
- a carrier structure (7) for separating the examination zone (3) from the RF transmit coil (5), wherein the carrier structure (7) is surrounded by the RF transmit antenna (6), wherein the carrier structure (7) is made of a first material having a first dielectric permittivity, wherein
- at least one recess (20) is foreseen in the carrier structure (7) between the layered capacitors structure (13) and a patient (8) in the examination zone (3), wherein the recess (20) extends fully circumferentially along the carrier structure (7), wherein
- the recess (20) is filled with at least a second material, so that the second material encircles the carrier structure (7) as an extra layer, the second material having a second dielectric permittivity, wherein the second dielectric permittivity of the second material is higher as the first dielectric permittivity of the first material of the carrier structure (7).

Embodiment 2. The radio frequency RF transmit coil (5) according to Embodiment 1, wherein the width of each recess (20) along the rungs (12) corresponds at least to the size of the overlapping parts of the rungs (12) and the first end ring (9) and second end ring (10).

Embodiment 3. The radio frequency RF transmit coil (5) according to any preceding Embodiment, wherein
- the carrier structure (7) thickness is between 8 mm to 12 mm and the depth of the recess (20) is between 2 mm and 6 mm.

Embodiment 4. The radio frequency RF transmit coil (5) according to any preceding Embodiment, wherein the dielectric material in the recess (20) has a permittivity between 50 and 100.

Embodiment 5. The radio frequency RF transmit coil (5) according to any preceding Embodiment, wherein the recess (20) is filled with at least two different materials forming an outer layer (21) at a system side and an inner layer (22) between the carrier structure (7) and the outer layer (21) to a patient side (16), wherein the permittivity of the outer layer (21) is different than from the inner layer (22).

Embodiment 6. The radio frequency RF transmit coil (5) according to Embodiment 5, wherein the dielectric permittivity of the outer layer (21) is higher than the dielectric permittivity of the inner layer (22) and the dielectric permittivity of the inner layer (22) is higher than the dielectric permittivity of the material of the carrier structure (7).

Embodiment 7. The radio frequency RF transmit coil (5) according to Embodiment 6, wherein the outer layer (21) has a dielectric permittivity between 50 and 100 and the inner layer (22) has a dielectric permittivity between 5 and 10.

Embodiment 8. The radio frequency RF transmit coil (5) according to Embodiments 5 to 7, wherein the thickness of the inner layer (22) and the thickness of the outer layer (21) are each half the depth of the recess (20).

Embodiment 9. The radio frequency RF transmit coil (5) according to any preceding Embodiment, wherein the recess (20) is filled with more than two layers (21, 22) of different materials.

Embodiment 10. The radio frequency RF transmit coil (5) according to any preceding Embodiment, wherein the RF transmit coil (5) is a quadrature body coil of a birdcage coil.

Embodiment 11. A magnetic resonance imaging system comprising a radio frequency RF transmit coil (5) according to any preceding Embodiment.

| REFERENCE SYMBOL LIST | |
|---|---|
| magnetic resonance imaging system | 1 |
| magnetic resonance imaging magnet | 2 |
| examination zone | 3 |
| gradient coil | 4 |
| body coil | 5 |
| RF transmit antenna | 6 |
| carrier structure | 7 |
| patient | 8 |
| first end ring | 9 |
| second end ring | 10 |
| rung section | 11 |
| rungs | 12 |
| region with layered capacitor in the ring section | 13 |
| RF transmit antenna system side | 14 |
| RF transmit antenna dielectric | 15 |
| RF transmit antenna patient side | 16 |
| open part | 17 |
| electric field coupling to the patient | 18 |
| recess | 19 |
| carrier structure gasket/recess filled with second material | 20 |
| outer layer carrier gasket | 21 |
| inner layer carrier gasket | 22 |

The invention claimed is:

1. A radio frequency transmit coil configured to transmit an RF field into a magnetic resonance examination zone of a magnetic resonance imaging system, the RF transmit coil comprising:

an RF transmit antenna wherein the RF transmit antenna is formed by a plurality of rungs disposed along a central axis of the examination zone around a volume, a first end ring connected to a first end of the plurality of rungs, a second end ring connected to a second end of the plurality of rungs, wherein a layered capacitors structure is formed by the overlapping parts of the rungs and the first end ring and the second end ring, a carrier structure for separating the examination zone from the RF transmit coil, wherein the carrier structure is surrounded by the RF transmit antenna, wherein the carrier structure is made of a first material having a first dielectric permittivity, wherein at least one recess is foreseen in the carrier structure between the layered capacitors structure and the examination zone, wherein the recess extends fully circumferentially and partially axially over the axial extension of at least one of the first and second end rings along the carrier structure, wherein the recess is filled with at least a second material, so that the second material encircles the carrier structure as an extra layer, the second material having a second dielectric permittivity, wherein the second dielectric permittivity of the second material is higher as the first dielectric permittivity of the first material of the carrier structure.

2. The RF transmit coil according to claim 1, wherein the width of each recess along the rungs corresponds at least to the size of the overlapping parts of the rungs and the first end ring and second end ring.

3. The RF transmit coil according t claim 1, wherein the carrier structure thickness is between 8 mm to 12 mm and the depth of the recess is between 2 mm and 6 mm.

4. The RF transmit coil according to claim 1, wherein the dielectric material in the recess has a permittivity between 50 and 100.

5. The RF transmit coil according to claim 1, wherein the recess is filled with at least two different materials forming an outer layer at a system side and an inner layer-between the carrier structure and the outer layer to a patient side, wherein the permittivity of the outer layer is different than from the inner layer.

6. The RF transmit coil according to claim 5, wherein the dielectric permittivity of the outer layer is higher than the dielectric permittivity of the inner layer and the dielectric permittivity of the inner layer is higher than the dielectric permittivity of the material of the carrier structure.

7. The RF transmit coil according to claim 6, wherein the outer layer has a dielectric permittivity between 50 and 100 and the inner layer has a dielectric permittivity between 5 and 10.

8. The RF transmit coil according to claim 5, wherein the thickness of the inner layer and the thickness of the outer layer are each half the depth of the recess.

9. The RF transmit coil according to claim 1, wherein the recess is filled with more than two layers of different materials.

10. The RF transmit coil according to claim 1, wherein the RF transmit coil is a quadrature body coil of a birdcage coil.

11. A magnetic resonance imaging system comprising the RF transmit coil according to claim 1.

* * * * *